United States Patent
Liang et al.

(10) Patent No.: US 12,309,922 B1
(45) Date of Patent: May 20, 2025

(54) ADAPTER BOARD AND MANUFACTURING METHOD THEREFOR, AND BOARD CARD CONNECTING STRUCTURE

(71) Applicant: Suzhou MetaBrain Intelligent Technology Co., Ltd., Suzhou (CN)

(72) Inventors: Lei Liang, Suzhou (CN); Qingsong Qin, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 18/870,184

(22) PCT Filed: Jun. 16, 2023

(86) PCT No.: PCT/CN2023/100843
§ 371 (c)(1),
(2) Date: Nov. 27, 2024

(87) PCT Pub. No.: WO2024/119756
PCT Pub. Date: Jun. 13, 2024

(30) Foreign Application Priority Data

Dec. 5, 2022 (CN) .......................... 202211551492.4

(51) Int. Cl.
*H05K 1/18* (2006.01)
*H01R 12/71* (2011.01)
(Continued)

(52) U.S. Cl.
CPC .......... *H05K 1/112* (2013.01); *H01R 12/716* (2013.01); *H01R 31/06* (2013.01); *H05K 1/184* (2013.01);
(Continued)

(58) Field of Classification Search
CPC ...... H05K 1/112; H05K 1/184; H05K 3/4038; H05K 2201/10189; H01R 12/716; H01R 31/06
See application file for complete search history.

(56) References Cited

U.S. PATENT DOCUMENTS

| | | | | |
|---|---|---|---|---|
| 3,876,822 A | * | 4/1975 | Davy | ................... H05K 1/0219 361/792 |
| 7,361,057 B1 | * | 4/2008 | Bao | ........................ H05K 3/368 439/946 |

(Continued)

FOREIGN PATENT DOCUMENTS

| CN | 202443962 U | 9/2012 |
|---|---|---|
| CN | 207166845 U | 3/2018 |

(Continued)

OTHER PUBLICATIONS

International Search Report and Written Opinion of corresponding PCT Application No. PCT/CN2023/100843 mailed Sep. 19, 2023 including English translations (12 pages).

(Continued)

*Primary Examiner* — Sherman Ng
(74) *Attorney, Agent, or Firm* — Crowell & Moring LLP (57) ABSTRACT

An adapter board includes a main body. Perforations are provided in a top face of the main body and configured to be in plug-in fit with a plug of the connector. Pads are provided on a bottom face of the main body and configured to be soldered to the board card. Row numbers r and column numbers n of the perforations and the pads are the same, and the perforations correspond to the pads on a one-to-one basis. The main body further includes a line passing area located between two adjacent columns of pads. A column spacing of the perforations is P, and a column spacing of the pads on two sides of the line passing area is M, where (Continued)

M−P≥H, and H is a minimum spacing allowed between adjacent differential lines of the board card.

20 Claims, 5 Drawing Sheets

(51) Int. Cl.
*H01R 31/06* (2006.01)
*H05K 1/11* (2006.01)
*H05K 3/40* (2006.01)

(52) U.S. Cl.
CPC . *H05K 3/4038* (2013.01); *H05K 2201/10189* (2013.01)

(56) References Cited

U.S. PATENT DOCUMENTS

| | | | | |
|---|---|---|---|---|
| 2003/0058628 | A1* | 3/2003 | Boylan | H05K 1/141 |
| | | | | 361/767 |
| 2006/0189180 | A1* | 8/2006 | Lang | H01R 12/7005 |
| | | | | 439/76.1 |
| 2006/0228079 | A1* | 10/2006 | Tamanuki | H01R 12/721 |
| | | | | 385/92 |
| 2013/0083505 | A1 | 4/2013 | Kobayashi | |
| 2017/0013716 | A1 | 1/2017 | Chandra et al. | |
| 2017/0099728 | A1* | 4/2017 | Janssen | H04B 3/30 |
| 2019/0350079 | A1* | 11/2019 | Chen | H01R 12/737 |

FOREIGN PATENT DOCUMENTS

| | | |
|---|---|---|
| CN | 108695295 A | 10/2018 |
| CN | 217546421 U | 10/2022 |
| CN | 115348721 A | 11/2022 |
| CN | 115568092 A | 1/2023 |
| JP | 2002043704 A | 2/2002 |

OTHER PUBLICATIONS

Search report of corresponding CN priority application (CN202211551492.4) Jan. 4, 2023 (2 pages).

First Office Action of corresponding CN priority application (CN202211551492.4) Jan. 10, 2023 including English translation (9 pages).

Notification to Grant Patent Right for Invention of corresponding CN priority application (CN202211551492.4) Feb. 16, 2023 including English translation (3 pages).

* cited by examiner

ADAPTER BOARD AND MANUFACTURING METHOD THEREFOR, AND BOARD CARD CONNECTING STRUCTURE

CROSS-REFERENCE TO RELATED APPLICATION

This application is the national phase application of International Patent Application No. PCT/CN2023/100843, filed Jun. 16, 2023, which claims priority to Chinese Patent Application No. 202211551492.4, filed on Dec. 5, 2022 in China National Intellectual Property Administration and entitled "Adapter Board and Manufacturing Method Therefor, and Board Card Connecting Structure". The contents of International Patent Application No. PCT/CN2023/100843 and Chinese Patent Application No. 202211551492.4 are each incorporated by reference in their entireties.

FIELD

The present application relates to the technical field of board card connection, in particular to an adapter board and a manufacturing method therefor, and a board card connecting structure.

BACKGROUND

In recent years, with the development trend of high-speed, dense, multi-function, and miniaturization of storage, server and network communication systems, the number of layers of a plurality of large PCB cards has increased, from the traditional 10 or 12 to more than 16 or even 20. Also, it is inevitable to use high-speed and dense connectors in the system to realize the interconnection between the plurality of board cards, and the speed is increased from 8 g, 16 g to 32 g or even 112 g. These changes have greatly improved the requirements for the performance of PCBs and connectors to meet the transmission requirements of high-speed interconnections, which will increase the cost of the PCB cards. How to improve the system performance and reduce the cost to the maximum extent is an urgent problem in product design and manufacturing.

In the traditional multi-board interconnection, dense connectors are directly crimped to perforations of the board cards, and the arrangement and number of the perforations have a one-by-one correspondence with connector pins.

Figure 1:
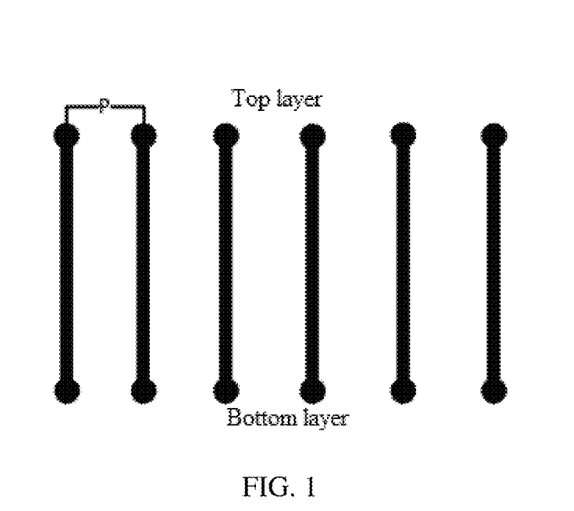
FIG. 1 shows a single-row perforation structure diagram in a side view state of a PCB in the related art.

From the side view of PCBs, the traditional perforation arrangement is shown in FIG. 1. It is assumed that the connector is a 6-row and 6-column connector. For the convenience of viewing, only one row is exemplified. In other words, through holes are used for connecting top and bottom layers and inner electrical layers. If there are perforation stub length requirements, a back drilling process will be used for eliminating stubs.

Figure 2:
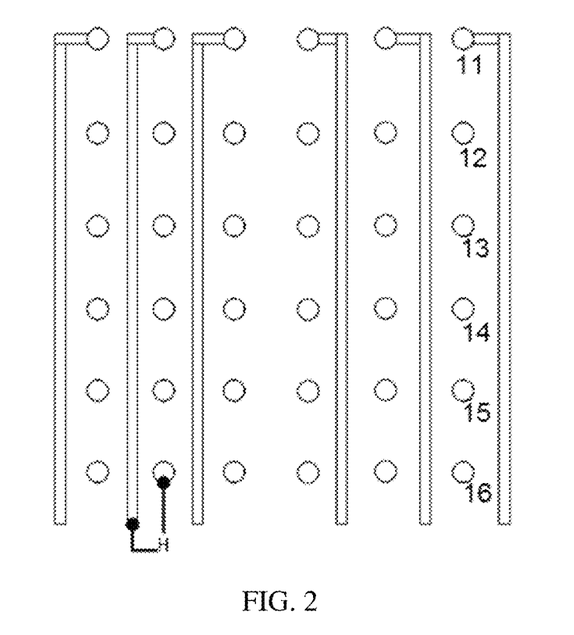
FIG. 2 shows an outgoing structure diagram in a top view state of a PCB in the related art.
Figure 3:
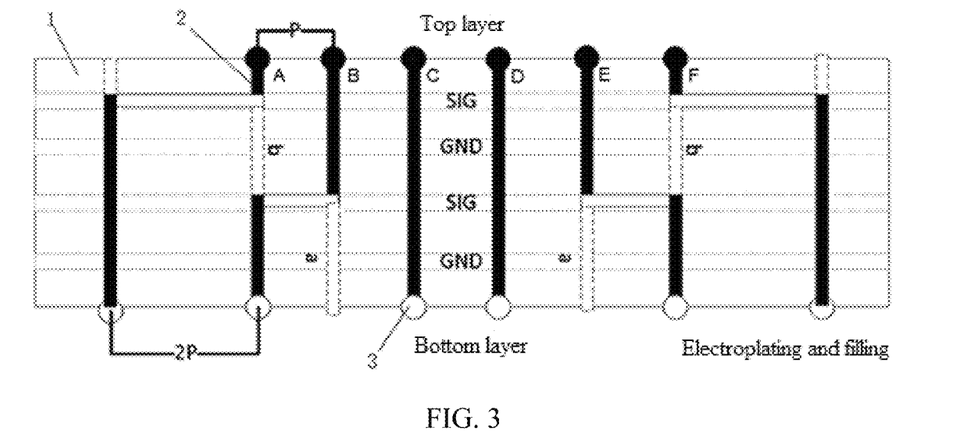
FIG. 3 shows a single-row routing structure diagram of an adapter board in some embodiments of the present application.

From the top view of PCBs, a traditional outgoing manner is shown in FIG. 2. Due to the limited spacing of each column of the connector, only a pair of differential lines (for the convenience of viewing, the differential lines are simplified to one line) may be routed in a channel between the columns. Then a routing layer is needed for connector pins of each row. Assuming that the connector has six rows, numbered in sequence as 11, 12, 13, 14, 15 and 16, six routing layers are needed to pull out all the lines. Therefore, as the connector has more rows, more routing layers are needed, which in turn increases the cost of the board card.

SUMMARY

A main objective of the present application is to provide an adapter board and a manufacturing method therefor, and a board card connecting structure, which can realize the reduced-layer connection of a board card, thereby effectively reducing the cost of the board card.

In order to achieve the above objective, according to an aspect of the present application, there is provided an adapter board, which is configured to realize adaptation between a connector and a board card, and comprises a main body. Perforations are provided in a top face of the main body and configured to be in plug-in fit with a plug of the connector. Pads are provided on a bottom face of the main body and configured to be soldered to the board card. Row numbers, represented by r, and column numbers, represented by n, of the perforations and the pads are the same, and the perforations correspond to the pads on a one-to-one basis. The main body further comprises a line passing area located between two adjacent columns of pads. A column spacing of the perforations is represented by P, and a column spacing of the pads on two sides of the line passing area is represented by M, where M−P≥H, and H represents a minimum spacing allowed between adjacent outgoing lines of the board card.

In one embodiment, under a circumstance that the board card performs one-way outgoing, a required number of routing layers represented by Y, Y=(r−1)/(2x−1), where x=M/P, Y≥1, and the number is rounded up.

In one embodiment, under a circumstance that the board card performs two-way outgoing, a required number of routing layers represented by Y, Y=(r−2)/2*(2x−1), where x=M/P, Y≥1, and the number is rounded up.

In one embodiment, M≥r*H.

In one embodiment, the row numbers r and column numbers n of the perforations and the pads are both even numbers, where M≥(r/2+1) H.

In one embodiment, the row numbers r and column numbers n of the perforations and the pads are both even numbers, where M≥r/2*H.

In one embodiment, the column spacing between two middle columns of pads is represented by P, the perforations in a first side of a boundary between the two middle columns of pads perform outgoing away from the boundary, and the perforations in a second side of the boundary perform outgoing away from the boundary.

In one embodiment, the column spacing between two middle columns of pads is represented by M, and the perforations in all columns perform outgoing to one side.

In one embodiment, the number of layers of the adapter board is represented by L, two middle columns of perforations are perforations in column n/2 and perforations in column n/2+1 respectively, the perforations in column n/2 and the perforations in column n/2+1 are through holes, the perforations in columns smaller than n/2 perform leftward outgoing, and the perforations in columns greater than n/2+1 perform rightward outgoing, where lines outgoing from different columns of perforations in the same side of the two middle columns of perforations are located in different layers.

In one embodiment, along a direction away from the perforations (2) in column n/2, after an outgoing distance of the perforations in column n/2−t (t=1, 2, 3, . . . , n/2−1) at layer L−2t is represented by t*P, the outgoing lines are connected to the pads on a bottom layer, when t=n/2−1, after an outgoing distance of the perforations at layer 2 is represented by (n/2−1)*P, the outgoing lines are connected to the bottom layer.

In one embodiment, under a circumstance that lateral outgoing lines interfere with the perforations, the perforations are treated by a blind buried perforation or broken perforation process.

In one embodiment, stubs of the perforations are treated by a back drilling process for the perforations.

In one embodiment, the perforations connected to the bottom layer form the pads by electroplating and filling.

In one embodiment, a left structure and a right structure of the adapter board are symmetrical about a boundary between the two middle columns of perforations.

In one embodiment, a spacing between the adjacent differential lines is greater than or equal to 1.5 H.

According to another aspect of the present application, there is provided a manufacturing method for the foregoing adapter board, comprising:

manufacturing a main body;

processing perforations in a top face of the main body, whereby a column spacing of the perforations is represented by P; and processing pads on a bottom face of the main body, whereby a column spacing of the pads on two sides of a line passing area of the main body is represented by M, where M−P≥H, H is representing a minimum spacing allowed between adjacent outgoing lines of the board card, row numbers and column numbers of the perforations and the pads are the same, and the perforations have a one-by-one correspondence with the pads.

In one embodiment, the processing perforations in a top face of the main body, whereby a column spacing of the perforations P comprises:

processing through holes in the top face of the main body according to a preset row spacing, where a column spacing between the through holes is represented by P, and the through holes serve as the perforations.

In one embodiment, the processing pads on a bottom face of the main body, whereby a column spacing of the pads on two sides of a line passing area of the main body is represented by M comprises:

processing the pads at the bottom of two middle columns of perforations;

allowing the perforations in a first side of a boundary between two middle columns of pads to perform outgoing away from the boundary, and processing the pads, at the ends of the outgoing lines, on the bottom face of the main body, whereby the pads are connected to the corresponding outgoing lines and perforations; and allowing the perforations in a second side of the boundary to perform outgoing away from the boundary, and processing the pads, at the ends of the outgoing lines, on the bottom face of the main body, whereby the pads are connected to the corresponding outgoing lines and perforations.

In one embodiment, the allowing the perforations in the first side of the boundary to perform outgoing away from the boundary, and processing the pads, at the ends of the outgoing lines, on the bottom face of the main body, whereby the pads are connected to the corresponding outgoing lines and perforations comprises:

setting two middle columns of perforations as perforations in column n/2 and perforations in column n/2+1 respectively, where the perforations in column n/2 and the perforations in column n/2+1 are through holes, the perforations in columns smaller than n/2 perform leftward outgoing, and the perforations in columns greater than n/2+1 perform rightward outgoing;

determining a distance of leftward outgoing of the perforations 2 in column n/2−1 at an outgoing layer that is adjacent to a bottom layer as 1*P, reaching the perforations 2 in column n/2−2, and then connecting to the bottom layer through the perforations 2; determining a distance of leftward outgoing of the perforations 2 in column n/2−2 at an outgoing layer that is less adjacent to the bottom layer as 2*P, and then connecting to the bottom layer through the perforations 2;

determining a distance of leftward outgoing of the perforations 2 in column n/2−3 at an outgoing layer that is further less adjacent to the bottom layer as 3*P, and then connecting to the bottom layer through the perforations 2;

determining a distance of leftward outgoing of the perforations 2 in column n/2−t at an outgoing layer that is further less adjacent to the bottom layer as t*P, and then connecting to the bottom layer through the perforations 2, where t=1, 2, 3, . . . , n/2−1;

and so on, determining a distance of leftward outgoing of the perforations 2 in column 1 as (n/2−1)*P, and then connecting to the bottom layer through the bottom perforations 2.

In one embodiment, the perforations are treated by a blind buried perforation or broken perforation process at a location where lateral outgoing lines interfere with the perforations.

In one embodiment, the perforations connected to the bottom layer form the pads on the bottom face of the main body by electroplating and filling.

According to another aspect of the present application, there is provided a board card connecting structure, comprising a connector and a board card, and further comprising the foregoing adapter board. The adapter board is connected between the connector and the board card. A plug of the connector is in plug-in fit with perforations in a top face of the adapter board. Pads on a bottom face of the adapter board are soldered to the board card.

In one embodiment, the board card is a single board or a backplane.

In one embodiment, under a circumstance that M≥r*H, the board card employs single-layer layout.

In one embodiment, under a circumstance that the row numbers r and column numbers n of the perforations and the pads are both even numbers and M≥(r/2+1) H, the board card employs double-layer layout in the same outgoing direction.

In one embodiment, under a circumstance that the row numbers r and column numbers n of the perforations and the pads are both even numbers and M≥r/2*H, the board card employs single-layer layout, the layout achieving two-way outgoing in a column direction of the board card.

According to the technical solutions of the present application, an adapter board is configured to realize adaptation between a connector and a board card, and includes a main body. Perforations are provided in a top face of the main body and configured to be in plug-in fit with a plug of the connector. Pads are provided on a bottom face of the main body and configured to be soldered to the board card. Row numbers, represented by r, and column numbers, represented by n, of the perforations and the pads are the same, and the perforations have a one-by-one correspondence with the pads. The main body further includes a line passing area located between two adjacent columns of pads. A column spacing of the perforations is represented by P, and a column spacing of the pads on two sides of the line passing area is represented by M, where M−P≥H, and His representing a minimum spacing allowed between adjacent outgoing lines of the board card. The adapter board has perforations and pads with different column spacings formed on a top face and a bottom face, and is connected to a connector using the same column spacing as the connector, and a larger pad column spacing is formed on the bottom face. By soldering the pads with a larger column spacing to a board card, the width of a line passing area of the board card soldered to the pads can be increased, whereby the line passing area may accommodate more outgoing lines simultaneously. A plurality of sets of outgoing lines may be arranged in one layer of the board card, whereby the board card can meet the outgoing requirements by adopting fewer board layers, thereby effectively reducing the board layers of the board card, achieving the purpose of layer reduction of the board card, and effectively reducing the cost of the board card.

BRIEF DESCRIPTION OF THE DRAWINGS

The drawings, constituting a part of the present application, serve to provide a further understanding of the present application. Exemplary embodiments of the present application and the description thereof serve to explain the present application and are not to be construed as unduly limiting the present application. In the drawings.

The above drawings include the following reference numerals:
1, main body; 2, perforation; 3, pad; 4, adapter board; 5, connector; 6, board card; 7, differential line.

DETAILED DESCRIPTION

It is to be noted that embodiments in the present application and features in the embodiments may be combined with each other without conflict. The present application will be described in detail below with reference to the accompanying drawings and in conjunction with embodiments.

Referring to FIG. 3 to FIG. 9, according to an embodiment of the present application, an adapter board is configured to realize adaptation between a connector 5 and a board card 6, and includes a main body 1. Perforations 2 are provided in a top face of the main body 1, and the perforations 2 are configured to be in plug-in fit with a plug of the connector 5. Pads 3 are provided on a bottom face of the main body 1, and the pads 3 are configured to be soldered to the board card 6. Row numbers r and column numbers n of the perforations 2 and the pads 3 are the same, and the perforations 2 have a one-by-one correspondence with the pads 3. The main body 1 further includes a line passing area located between two adjacent columns of pads 3. A column spacing of the perforations 2 is represented by P, and a column spacing of the pads 3 on two sides of the line passing area is represented by M, where M−P≥H, and H is representing a minimum spacing allowed between adjacent differential lines 7 of the board card 6. The minimum spacing H allowed between adjacent differential lines 7 is a safety distance between the differential lines 7. The safety distance refers to a shortest spatial distance measured between two conductive components or routes, namely a shortest distance that can be insulated by air on the premise of ensuring the stability and safety of electrical performance.

Here, P in the present application is defined as a plug column spacing of the connector 5, namely a column spacing of the perforations 2, fitting the plug of the connector 5, on the top face of the adapter board. In other words, only the plug column spacing of the connector 5 and the column spacing of the perforations 2, in plug-in fit with the plug of the connector 5, of the adapter board are required to satisfy the column spacing P, and the column spacing of the perforations 2 at other positions is not required to satisfy this limitation.

In order to avoid the influence of undesirable return paths, differential pair routing may be employed. In order to obtain better signal integrity, differential pairs may be selected to route high-speed signals. Differential signal transmission has many advantages as follows:

1. The total dI/dr of the output drive will be greatly reduced, thus reducing track collapse and potential electromagnetic interference.
2. Compared with a single-ended amplifier, a differential amplifier in a receiver has higher gain.
3. When a differential signal is transmitted in a tightly coupled differential pairs, it is more robust against crosstalk and sudden change in the return path.
4. Because each signal has a respective return path, a differential new signal is not easily interfered by switching noise when passing through a connector or being packaged.

Differential pair routing is required to follow the following principles:

1. A distance, represented by S, between two signal routes of a differential pair is kept constant throughout the route.
2. A signal crosstalk between two differential pairs is minimized.
3. The distance S between the two signal routes of the differential pair is designed to minimize the reflection impedance of an element.
4. The lengths of two differential signal lines are kept equal to eliminate a phase difference of the signals.
5. A plurality of perforations are prevented from being used on differential pairs, which will produce impedance mismatch and inductance.

The adapter board has the perforations 2 and the pads 3 with different column spacings formed on the top face and the bottom face, and is connected to the connector 5 using the same column spacing as the connector 5, and a larger pad column spacing is formed on the bottom face. By soldering the pads 3 with a larger column spacing to the board card 6, the width of the line passing area of the board card 6 soldered to the pads 3 can be increased, whereby the line passing area may accommodate more outgoing lines simultaneously. A plurality of sets of outgoing lines may be arranged in a one-layer structure of the board card 6, whereby the board card 6 can meet the outgoing requirements by adopting fewer board layers, thereby effectively reducing the board layers of the board card 6, achieving the purpose of layer reduction of the board card 6, and effectively reducing the cost of the board card 6.

Furthermore, due to the arrangement of the adapter board, the column spacing of the perforations 2 on a top layer and the column spacing of the pads 3 on a bottom layer may be different, whereby the column spacing of the pads 3 is no longer limited by the structure of the connector 5. Therefore, a larger column spacing may be selected, whereby the column spacing of solder joints for soldering the board card 6 and the pads 3 may be designed more flexibly, the column spacing between the solder joints of the board card 6 can be increased as required, the spacing between the adjacent differential lines 7 of the board card 6 can be increased, and the spacing between the adjacent differential lines 7 can be greater than the minimum spacing H allowed between the adjacent differential lines 7. Since the spacing may be flexibly set, the column spacing of the pads 3 may be designed according to the optimal spacing between the differential lines 7 and the comprehensive consideration of the structure of the board card 6, whereby the board card 6 can reduce crosstalk in a connector outgoing area while realizing layer reduction, thereby achieving the dual purposes of cost reduction of the board card and signal quality improvement.

In this embodiment, the adapter board mainly plays the role of adjusting the connection spacing between the connector 5 and the board card 6. By specially designing the adapter board, an upper connecting structure and a lower connecting structure of the adapter board may be presented in different states, whereby the connection between the connector 5 and the board card 6 with different specifications can be realized, the adaptation range of the connector 5 and the board card 6 is expanded, the design of the board card 6 is no longer constrained by the connector 5, and the design is more flexible.

The adapter board employs a PCB structure. PCB is the abbreviation of printed circuit board. A base material of the PCB is composed of a dielectric layer (insulating material) and a high-purity conductor (copper foil). The commonly used base material of the PCB is mainly a copper-clad epoxy glass fiber cloth laminate, also known as an FR-4 all-glass fiber board, which is laminated with glass fiber cloth impregnated with epoxy resin.

Figure 8:
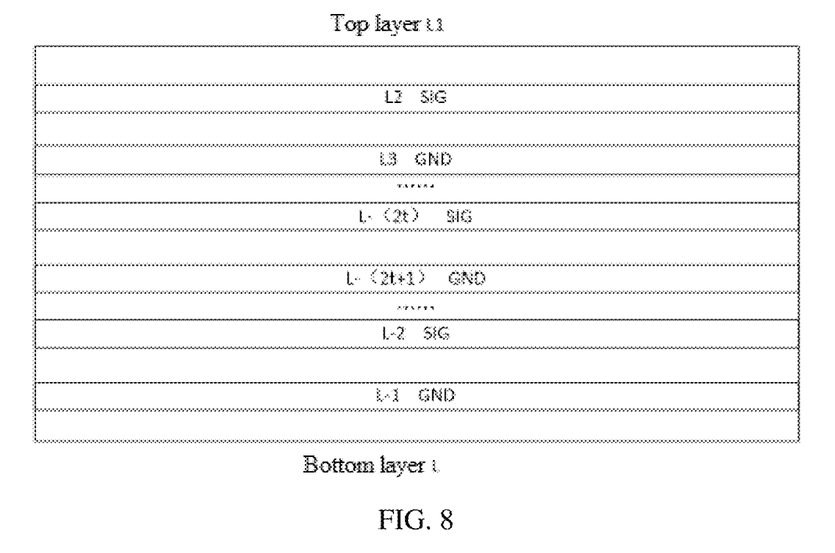
FIG. 8 shows a schematic diagram of a laminated structure of an adapter board in some embodiments of the present application.
Figure 9:
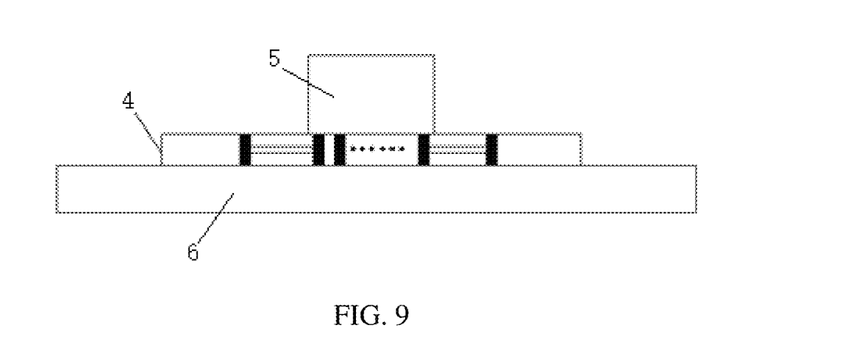
FIG. 9 shows a structural schematic diagram of a board card connecting structure in some embodiments of the present application.

A lamination definition of the adapter board of this embodiment is shown in FIG. 8. A bottom layer is a pad layer, layer L−1 adjacent to the bottom layer is a gnd reflow layer, layer L−2 adjacent to L−1 is a sig signal layer, L−3 is a gnd reflow layer, L−4 is a sig signal layer, and so on, L−(2t+1) is a gnd reflow layer, L−2t is a signal layer, layer L2 adjacent to a top layer is a sig signal layer, and the top layer L1 is grounded except a signal area as a reflow layer of L2. Since L is an even number, all even layers except the top and bottom layers are sig signal layers, and odd layers are gnd reflow layers.

In one embodiment, $M \geq r*H$. In this embodiment, M may be equal to $r*H$ or may be greater than $r*H$.

When $M=r*H$, adjacent pads 3 may be spaced by $r-1*H$ spacings, and a differential line may be arranged at each H spacing. Since each column of pads 3 includes r pieces of pads 3 and outgoing side pads of a single column may directly perform outgoing, when the column spacing of pads 3 is represented by M, $r-1+1=r$ outgoing lines may be accommodated in the line passing area between the adjacent pads 3. In other words, r rows of outgoing lines may be accommodated in the line passing area between adjacent perforations of the board card 6. Since the row number of the board card 6 is represented by r, r rows of outgoing lines are needed, and the width of the line passing area between the adjacent perforations of the board card 6 may meet the width required by the outgoing lines of the same row of perforations in the same layer. At this moment, the board card 6 only needs a single-layer structure to realize the outgoing of each perforation, which meets the outgoing requirement of the board card 6. Since the board card 6 may adopt a single-layer structure, the structural complexity of the board card 6 is greatly reduced, the design difficulty and cost are also greatly reduced, and the spacing between the differential lines 7 of the board card 6 may also meet the design requirement, thus realizing the simple and convenient design of the board card 6.

When $M>r*H$, the adjacent pads 3 may be spaced by $r-1*M/r$ spacings. Since $M/r>H$, the spacing between the differential lines 7 of the board card 6 is greater than the minimum spacing allowed between the adjacent differential lines 7 of the board card 6, and the outgoing requirements of the board card 6 can be met. Also, since the spacing between the differential lines 7 is increased, crosstalk in the connector outgoing area can be reduced, and the signal quality can be improved.

Assuming that only one set of differential lines can be routed between columns of the connector and the differential lines are routed in the middle of the two columns, $H=P/2$. If the spacing is increased to x times P, there may be $2x-1$ sets of differential lines outgoing between the two columns.

Figure 4:
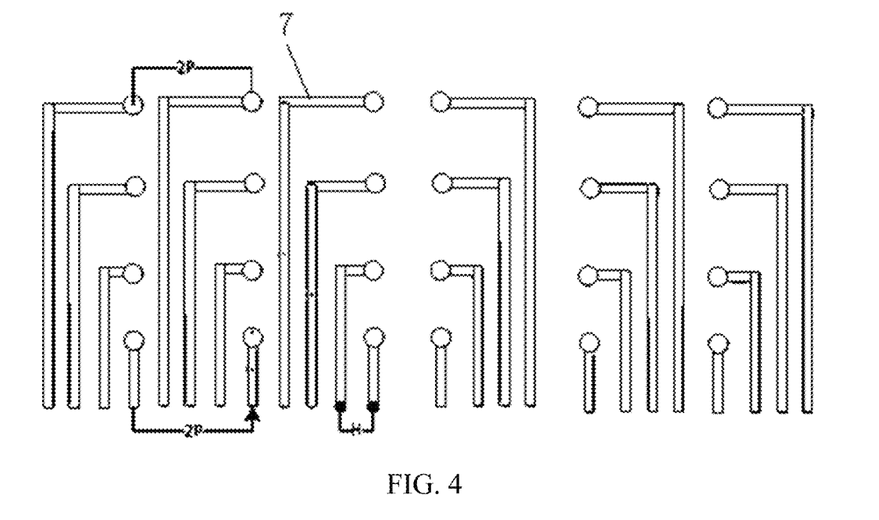
FIG. 4 shows a single-layer layout structure diagram of a board card in some embodiments of the present application.

Taking FIG. 4 as an example, compared with the related art of FIG. 2, under the condition that the outgoing spacing H remains unchanged, the spacing between the two columns is increased from P to 2P. In other words, $M=2P$. In this case, there may be 3 sets of outgoing lines between the two columns of perforations (one set of outgoing lines is obtained from the bottom row of pins, and three sets of lines corresponding to the upper three rows of pins are obtained from the middle of the two columns). Since outgoing lines may be directly obtained from the outermost pins without occupying the pin spacing, if the connector has 4 rows, only one layer is needed to complete outgoing of all pins. According to the traditional outgoing mode, 4 layers are needed. Therefore, compared with the conventional outgoing structure, the adapter board according to the embodiments of the present application can reduce the number of layers required for the outgoing of the board card by $(4-1)/4=3/4=75\%$, thereby greatly reducing the number of layers of the board card and reducing the cost of the board card.

In one embodiment, the row numbers r and column numbers n of the perforations 2 and the pads 3 are both even numbers, where $M \geq (r/2+1)*H$.

In this embodiment, the adapter board structure is suitable for a double-layer board card structure, and the outgoing direction of a single column of perforations of the double-layer board card structure is the same. In this embodiment, when the board card structure is a double-layer structure, among the perforations of the first layer, the perforations at the outgoing end may directly perform outgoing, and the outgoing spacing of other perforations is as follow: $(M-1+1)/(r/2) \geq (r/2+1-1+1)*H(r/2)=H+2H/r>H$. At this moment, the outgoing spacing of the board card may meet the outgoing width requirement. Among the perforations of the second layer, since the line passing direction of a single column of perforations is the same, there are no perforations that may directly perform outgoing among the perforations of the second layer, and misaligned outgoing is needed. At this moment, the outgoing spacing of the perforations of the second layer is as follow: $(M-1)/(r/2) \geq (r/2+1-1)*H/(r/2) = H$, and the outgoing width requirement may also be met. If M is set to $M=r/2*H$ at this moment, the outgoing spacing of the first layer may meet the outgoing requirements, but the outgoing spacing of the second layer will be too small to meet the outgoing width requirements due to the need to avoid interference between the perforations.

Figure 5:
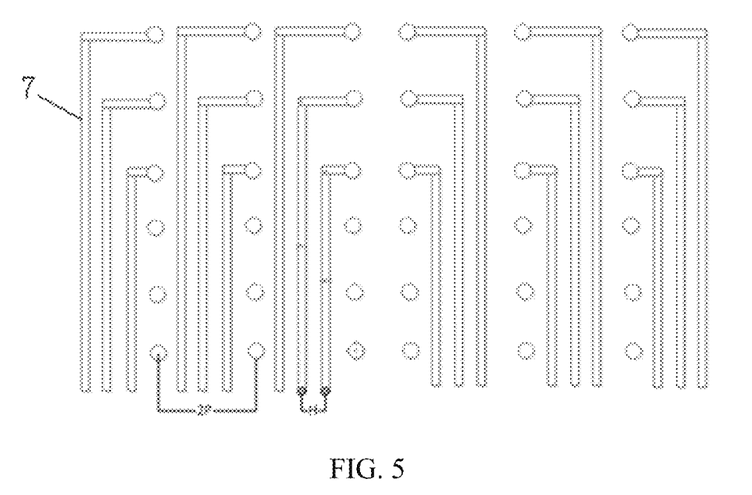
FIG. 5 shows a first-layer layout structure diagram in one-way routing of a board card in some embodiments of the present application.
Figure 6:
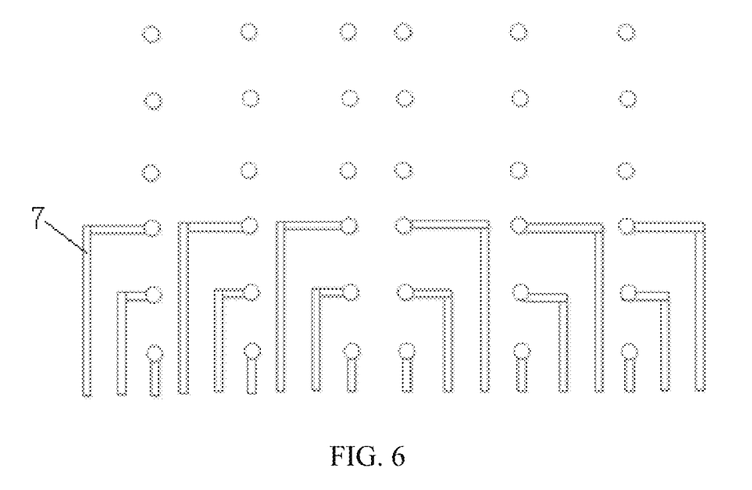
FIG. 6 shows a second-layer layout structure diagram in one-way routing of a board card in some embodiments of the present application.

If the connector is 6 rows as shown in FIG. 5, only two layers are needed to complete all pin outgoing. Since x=2, there may be 2*2−1=3 rows of outgoing lines in each layer, and there are a total of 6 rows/3 rows=2 layers. In the same way, if the row number is 10, there are 3 rows of outgoing lines in each layer. Since the outermost side may directly perform outgoing, 9 rows need to occupy the column spacing, and there are a total of 9 rows/3 rows=3 layers.

For one-way outgoing, it is assumed that the differential lines are routed in the middle of two columns. That is, H=P/2. Then, the formula is: (row number r−1)/(2x−1)=number of required routing layers Y ($\geq 1$), and it is rounded up.

In addition, if the space allows, the foregoing displacement spacing 2P may continue to increase, thereby further reducing layers or reducing crosstalk. For example, if the spacing is increased to 3P, there may be 5 sets of outgoing lines between two columns of pads, which are added with one set of bottom outgoing lines to obtain outgoing lines of 6 rows of connectors in one layer, thereby further reducing board layers of a target board. Alternatively, the number of outgoing lines is reduced, the line spacing H is increased, and the crosstalk is reduced, which may be flexibly selected according to the demands of a target board card.

Figure 7:
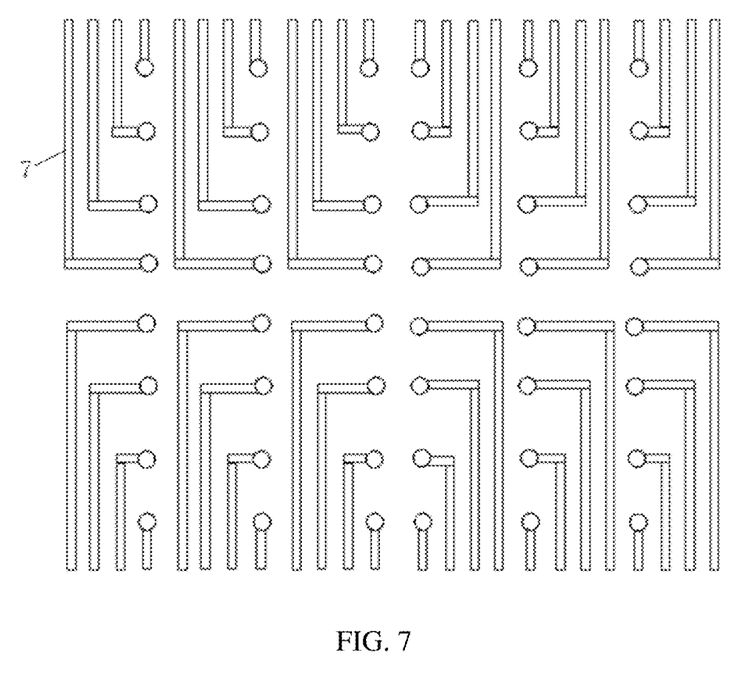
FIG. 7 shows a layout structure diagram in two-way routing of a board card in some embodiments of the present application.

As shown in FIG. 7, in one embodiment, if the connector is not at the edge of the board card, and two-way outgoing may be allowed. Then only 1 layer is needed to complete the outgoing of 8 rows of connectors. If the spacing is increased to x times P, there may be 2*(2x−1) sets of differential lines outgoing between the two columns due to two-way outgoing. Since the outermost two sets of pins may directly perform outgoing without occupying the pin spacing, (8−2)/(2*3)=1, that is, one routing layer is needed.

For two-way outgoing, it is assumed that the differential lines are routed in the middle of two columns. That is, H=P/2. The formula is: (row number r−2)/2*(2x−1)=number of required routing layers Y ($\geq 1$), and it is rounded up.

In one embodiment, the row numbers r and column numbers n of the perforations 2 and the pads 3 are both even numbers, where $M \geq r/2*H$.

In this embodiment, the adapter board structure is suitable for a single-layer board card structure, and the outgoing direction of a single column of perforations of the single-layer board card structure is the same. Taking a midpoint of a single column of perforations as a boundary, a single column of perforations on a first side of the midpoint performs outgoing to the first side, and a single column of perforations on a second side of the midpoint performs outgoing to the second side.

In this embodiment, for an outgoing structure on a first side of a midpoint of the board card, among the perforations of the first layer, the perforations at the outgoing end may directly perform outgoing, and the outgoing spacing of other perforations is $(M-1+1)/(r/2) \geq (r/2-1+1)*H/(r/2) = H$. At this moment, the outgoing spacing of the board card may meet the outgoing width requirement. For an outgoing structure on a second side of the midpoint of the board card, among the perforations of the second side, since the outgoing direction of the perforations of the second side is different from the outgoing direction of the perforations of the first side, the perforations at the outgoing end may directly perform outgoing without interfering with the perforations of the first side, and the outgoing spacing of other perforations is $(M-1+1)/(r/2) \geq (r/2-1+1)*H/(r/2) = H$. At this moment, the outgoing spacing of the board card may meet the outgoing width requirement.

As shown in FIG. 7, for the adapter board structure with r=8, namely 8 rows of perforations, the corresponding board card 6 also has 8 perforations 2, and the column spacing of the pads 3 is $M=8/2*H=4H$. In other words, the board card 6 can meet the column spacing requirement of the single-layer layout only by meeting $M=4H$.

In one embodiment, the row numbers r and column numbers n of the perforations 2 and the pads 3 are both even numbers, where $M \geq 2 (r/2+1)*H$.

This scheme may be applied to a two-way outgoing structure of a single column of perforations of the double-layer board card structure.

In one embodiment, the column spacing between two middle columns of pads 3 is P, the perforations 2 in a first side of a boundary between the two middle columns of pads 3 perform outgoing away from the boundary, and the perforations 2 in a second side of the boundary perform outgoing away from the boundary.

In this embodiment, since an area between the two middle columns of pads 3 is not required for outgoing, the column spacing between the two middle columns of pads 3 may be different from the column spacing with other pads 3, and the same structure as the column spacing of the perforations may be directly adopted without adjusting the distribution position of the pads 3 on the bottom face of the adapter board by routing and without misalignment of the two middle columns of pads 3 and the two middle columns of perforations 2. Therefore, an area requiring structural modification of the adapter board can be reduced, the processing procedure of the adapter board can be reduced, and the processing difficulty and processing cost of the adapter board can be reduced. Since the position and setting manner of the two middle columns of pads 3 are the same as the position and setting manner of the corresponding perforations 2 on the top face, the processing of the two middle columns of perforations 2 may be completed by directly setting the perforations 2 as through holes, and the pads are processed on the opposite side of the two middle columns of perforations 2, namely the bottom layer of the adapter board, so as to realize the processing design of the two middle columns of perforations 2 and pads 3.

In one embodiment, the column spacing between two middle columns of pads 3 is M, and the perforations 2 in all columns perform outgoing to one side. In this embodiment, another processing setting manner for perforations 2 and pads 3 is provided. In this embodiment, since the perforations 2 in each column all perform outgoing to the same side, the column spacing between the two middle columns of pads 3 also needs to meet the outgoing requirements of the board card 6. At this moment, the column spacing between the pads 3 of adjacent columns of the entire adapter board is M, whereby the outgoing width requirements of the board card 6 can be met.

Hereinafter, for convenience of description, the outgoing orientation of the board card is defined with reference to FIG. 4. The left side in FIG. 4 is the left side described in each embodiment of the present application, and the right side in FIG. 4 is the right side described in each embodiment of the present application.

In one embodiment, the number of layers of the adapter board is L, two middle columns of perforations 2 are perforations 2 in column n/2 and perforations 2 in column n/2+1 respectively, the perforations 2 in column n/2 and the perforations 2 in column n/2+1 are through holes, the perforations 2 in columns smaller than n/2 perform leftward outgoing, and the perforations 2 in columns greater than n/2+1 perform rightward outgoing, where lines outgoing from different columns of perforations 2 in the same side of the two middle columns of perforations 2 are located in different layers.

In one embodiment, a distance of leftward outgoing of the perforations 2 in column n/2-1 at an outgoing layer that is adjacent to a bottom layer is M-P, the perforations 2 in column n/2-2 are reached, and the outgoing lines are then connected to the bottom layer. A distance of leftward outgoing of the perforations 2 in column n/2-2 at an outgoing layer that is less adjacent to the bottom layer is represented by M, and the outgoing lines are then connected to the bottom layer. A distance of leftward outgoing of the perforations 2 in column n/2-3 at an outgoing layer that is further less adjacent to the bottom layer is represented by M, and so on, until a distance of leftward outgoing of the perforations 2 in column 1 is M and the outgoing lines are then connected to the bottom layer.

In this embodiment, taking M=2P as an example, the perforations 2 in the adapter board are sorted in a direction from left to right. The detailed process of designing the perforations 2 of the adapter board is that two middle columns, namely columns n/2 and n/2+1, of perforations are through holes. Leftward outgoing is performed in columns having sequence numbers smaller than n/2, and rightward outgoing is performed in columns having sequence numbers greater than n/2+1. It is assumed that the number of PCB layers of the adapter board is represented by L. When t=1, a distance of leftward outgoing of the perforations in column n/2-t=n/2-1 at an outgoing layer that is adjacent to the bottom layer, namely layer L-2t=L-2 is t*P=1*P, that is, the perforations in column n/2-2 is reached, and the outgoing lines are then connected to the bottom layer through the perforations at the lower side of outgoing. When t=2, a distance of leftward outgoing of the perforations in column n/2-t=n/2-2 at an outgoing layer that is less adjacent to the bottom layer, namely layer L-2t=L-4 is t*P=2P, and the outgoing lines are then connected to the bottom layer through the perforations at the lower side of outgoing. A distance of leftward outgoing of the perforations in column n/2-3 at an outgoing layer that is further less adjacent to the bottom layer, namely layer L-3t=L-6 is t*P=3P, and the outgoing lines are then connected to the bottom layer through the perforations at the lower side of outgoing, and so on, after an outgoing distance of t*P of the perforations in column n/2-t at layer L-2t, the outgoing lines are connected to the pads on the bottom layer. When t=n/2-1, that is, n/2-t is column 1, after an outgoing distance of (n/2-1)*P at layer L-2t=L-2*(n/2-1)=L-(n-2), the outgoing lines are connected to the bottom layer. At this moment, all outgoing lines of the adapter board are completed, and the outgoing layer L-(n-2) should be layer 2. Therefore, the number of layers of the adapter board is L=n. That is, the number of layers of the adapter board is the same as the column number of the connector. The outgoing method for column n/2+t is the same as that for column n/2-t, and will not be described in detail herein.

In this embodiment, in order to facilitate differentiation, the number of rows of perforations is indicated by the numbers 11, 12 . . . , i.e., the first row is numbered as row 11, the second row is numbered as row 12, and so on, and the number of columns of perforations is indicated by the numbers A, B . . . i.e., the first column is numbered as column A, the second column is numbered as column B, and so on. That is, column 1 is numbered as column A, column 2 is numbered as column B, and so on.

In the structural design, with reference to the two middle columns of perforations, the number of outgoing layers of the perforations in each column gradually approaches the top layer along the direction away from the two middle columns of perforations. In this way, the perforation interference situation in the outgoing process can be reasonably optimized. While the corresponding connection between the perforations 2 and the pads 3 is realized, the position conversion between the top layer and the bottom layer of the perforations 2 can be realized through the outgoing of different middle layers, so as to avoid the problem that the connection positions of the perforations 2 and the outgoing layers cannot be effectively allocated due to interference caused by the mismatch between the design of the outgoing layers and the position of the perforations 2.

Through the above structure, each layer of outgoing lines does not interfere with adjacent perforations or outgoing lines in the process of downward connecting to the bottom face of the adapter board through the perforations, and an orderly and reasonable layout of layer-by-layer misalignment and layer-by-layer rising is formed.

In one embodiment, when lateral outgoing lines interfere with the perforations 2, the perforations 2 are treated by a blind buried perforation or broken perforation process. Stubs of the perforations 2 are treated by a back drilling process for the perforations 2.

In the above perforation design process, since the perforation position of the bottom layer will be offset by routing, the interference between the routing and the perforations will occur. At this moment, the perforations need to be processed to avoid the connection phenomenon between different perforations. In this case, the perforations that interfere with the routing may be treated by blind buried perforation or other broken perforation processes in an area between a routing layer and a previous layer, such as area a, so as to cut off the connection between adjacent perforations and realize the independence between the perforations. If the routing does not interfere with the perforations, but perforation stubs appear due to the outgoing structure, and the perforation stubs exceed the design requirements, a perforation back drilling process may be used for treating the perforation stubs, such as area a, whereby the processed perforations can meet the design requirements.

The perforations are generally divided into three categories: through holes, blind perforations, and buried perforations.

The blind perforations refer to perforations in top and bottom surfaces of a printed circuit board, which have a certain depth, and are used for the connection between a surface circuit and an inner circuit below. The depth and diameter of the perforations usually do not exceed a certain ratio.

The buried perforations refer to connection holes located in an inner layer of the printed circuit board, which do not extend to the surface of the circuit board.

The through holes pass through the entire circuit board and may be used for realizing internal interconnection or as mounting and positioning holes for components. Since the through holes are easier to implement in technology and have lower cost, the through holes are generally used in the printed circuit board.

The blind perforations are of a perforation type that connects inner routing of the PCB with surface routing of the PCB, and do not penetrate the entire board. The buried perforations are of a perforation type that only connects the routing between the inner layers, and cannot be seen from the surface of the PCB. Through the above blind buried perforation process, broken perforations may be treated, which meets the requirements of perforation transformation in the design process of the adapter board.

In a high-speed multilayer PCB, signals need to be connected through perforations when transmitted from one layer of interconnect lines to another layer of interconnect lines. When the frequency is lower than 1 GHz, the perforations can play a good connection role, and the parasitic capacitance and inductance thereof can be ignored.

When the frequency is higher than 1 GHz, the influence of the parasitic effect of the perforations on signal integrity cannot be ignored. At this moment, the perforations appear as breakpoints with discontinuous impedance on a transmission path, which will cause signal reflection, delay, attenuation, and other signal integrity problems.

When the signal is transmitted to another layer through the perforations, a reference layer of a signal line also serves as a return path of the perforation signal, and return current will flow between the reference layers through capacitive coupling, and will cause problems such as ground bounce.

It can be seen that in high-speed PCB design, seemingly simple perforations often bring great negative effects to circuit design. In order to reduce the adverse influence caused by the parasitic effects of perforations, the perforations may be designed with reference to the following manners:

1. A reasonable perforation size is selected. For multilayer PCB design with general density, it is preferred to select perforations of 0.25 mm/0.51 mm/0.91 mm (drill hole/pad/POWER isolation area). For some high-density PCBs, perforations of 0.20 mm/0.46 mm/0.86 mm may also be used, and non-through guiding holes may also be tried. Larger perforations of power supply or ground lines may be used to reduce impedance.
2. A larger POWER isolation area is preferred, and the perforation density on the PCB is considered.
3. Using a thinner PCB is beneficial to reduce two parasitic parameters of perforations.
4. Pins of a power supply and ground should be close to the perforations. Shorter leads between the perforations and the pins are preferred since the inductance may be increased. At the same time, the leads of the power supply and the ground should be as thick as possible to reduce impedance.
5. Some grounded perforations are provided near the perforations of signal layer change to provide a short-distance loop for signals.

Back drilling means that copper removes through-hole sections in the perforations that do not play any role in connection or transmission by secondary drilling. The through-hole sections will cause reflection, scattering, delay, and the like of signal transmission and signal distortion.

The back drilling has the following advantages:
1) reducing noise interference;
2) improving signal integrity;
3) reducing local board thickness; and
4) reducing the use of buried blind perforations and reducing the difficulty of PCB manufacturing.

The research shows that the main factors affecting the signal integrity of a signal system are design, board materials, transmission lines, connectors, chip packaging, and the like, and perforations have great influence on the signal integrity. The function of back drilling is to drill out the through-hole sections that do not play any role in connection or transmission, so as to avoid the reflection, scattering, delay, and the like of high-speed signal transmission, which will bring "distortion" to the signal.

In one embodiment, the perforations 2 connected to the bottom layer form the pads 3 by electroplating and filling.

By performing array electroplating and filling on the perforations 2 in the modified bottom layer, a pad array may be formed on the bottom layer of the adapter board, which is convenient to realize soldering and fixing with the board card 6. The outgoing rules for rightward outgoing in columns with sequence numbers greater than n/2+1 are the same as those for leftward outgoing, and will not be described in detail herein.

In one embodiment, a left structure and a right structure of the adapter board are symmetrical about a boundary between the two middle columns of perforations 2.

In this embodiment, a left structure and a right structure of the adapter board are symmetrical about a boundary between the two middle columns of perforations 2. Therefore, the design suitable for the left structure of the adapter board is also suitable for the right structure of the adapter board. The left structure and the right structure of the adapter board are symmetrical, whereby the overall structure of the adapter board can be a symmetrical structure, the structural performance is better, and the design performance is better.

In one embodiment, a spacing between the adjacent differential lines 7 is greater than or equal to 1.5 H.

In this embodiment, since the outgoing spacing of the board card 6 is determined by the column spacing between the pads 3 of the adapter board, and the column spacing between the pads 3 of the adapter board may be set as needed when the space of the board card 6 allows, the column spacing between the pads 3 may be reasonably set, and then the optimized design of the outgoing spacing of the board card 6 can be realized, whereby the outgoing spacing can more effectively reduce connector crosstalk in the connector outgoing area. In this embodiment, when the spacing between the adjacent differential lines 7 is set to be greater than or equal to 1.5 H, the above requirements can be better met. The spacing between the adjacent differential lines 7 may also be adjusted according to the structure and specification of the board card 6.

Figure 10:
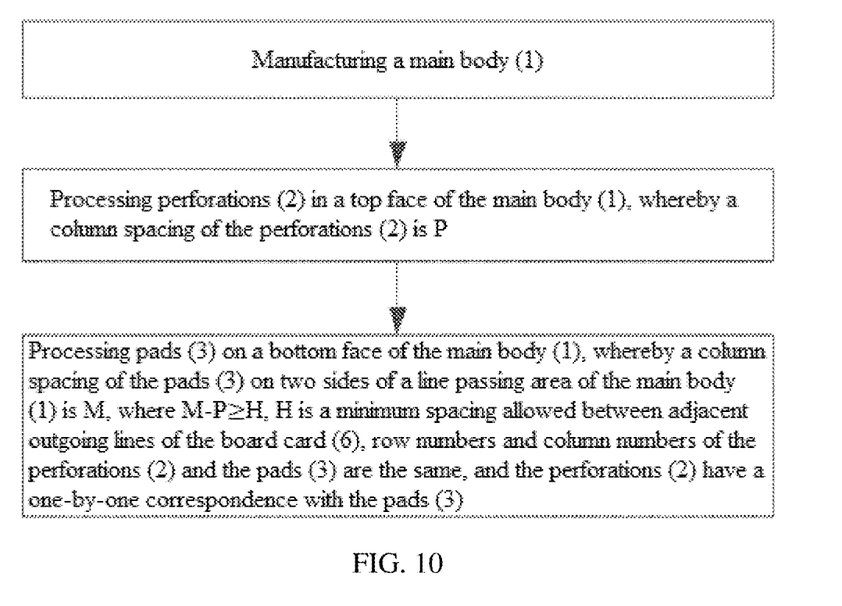
FIG. 10 shows a flowchart of a manufacturing method for an adapter board in some embodiments of the present application.

Referring to FIG. 10, according to an embodiment of the present application, a manufacturing method for the foregoing adapter board includes: manufacturing a main body 1; processing perforations 2 in a top face of the main body 1, whereby a column spacing of the perforations 2 is represented by P; and processing pads 3 on a bottom face of the main body 1, whereby a column spacing of the pads 3 on two sides of a line passing area of the main body 1 is represented by M, where M−P≥H, H is representing a minimum spacing allowed between adjacent outgoing lines of the board card 6, row numbers and column numbers of the perforations 2 and the pads 3 are the same, and the perforations 2 have a one-by-one correspondence with the pads 3.

In this embodiment, since the specification design of the adapter board needs to be determined according to the specifications of the connector 5 and the board card 6 fitting each other, before the manufacture of the adapter board, it is necessary to first confirm the number of outgoing layers L required by the target board card 6 according to actual demands or costs, to determine the specification of the connector 5 used, namely the row number r and the column number n, and then to determine the design specification of the adapter board, whereby the adapter board can meet the adaptation requirements of the connector 5 and the board card 6.

Through the adapter board manufactured using the foregoing manufacturing method, the perforations 2 and the pads 3 with different column spacings may be formed on the top face and the bottom face, thereby realizing connection with the connector 5 using the same column spacing as the connector 5, and forming a larger pad column spacing on the bottom face. By soldering the pads 3 with a larger column spacing to the board card 6, the width of the line passing area of the board card 6 soldered to the pads 3 can be increased, whereby the line passing area may accommodate more outgoing lines simultaneously. A plurality of sets of outgoing lines may be arranged in a one-layer structure of the board card 6, whereby the board card 6 can meet the outgoing requirements by adopting fewer board layers, thereby effectively reducing the board layers of the board card 6, achieving the purpose of layer reduction of the board card 6, and effectively reducing the cost of the board card 6.

Furthermore, through the adapter board manufactured using the foregoing method, the column spacing of the perforations 2 on a top layer and the column spacing of the pads 3 on a bottom layer may be different, whereby the column spacing of the pads 3 is no longer limited by the structure of the connector 5. Therefore, a larger column spacing may be selected, whereby the column spacing of solder joints for soldering the board card 6 and the pads 3 may be designed more flexibly, the column spacing between the solder joints of the board card 6 can be increased as required, the spacing between the adjacent differential lines 7 of the board card 6 can be increased, and the spacing between the adjacent differential lines 7 can be greater than the minimum spacing H allowed between the adjacent differential lines 7. Since the spacing may be flexibly set, the column spacing of the pads 3 may be designed according to the optimal spacing between the differential lines 7 and the comprehensive consideration of the structure of the board card 6, whereby the board card 6 can reduce crosstalk in a connector outgoing area while realizing layer reduction, thereby achieving the dual purposes of cost reduction of the board card and signal quality improvement.

In one embodiment, the processing perforations 2 in a top face of the main body 1, whereby a column spacing of the perforations 2 is represented by P, including: processing through holes in the top face of the main body 1 according to a preset row spacing, where a column spacing between the through holes is represented by P, and the through holes serve as the perforations 2.

In one embodiment, the processing pads 3 on a bottom face of the main body 1, whereby a column spacing of the pads 3 on two sides of a line passing area of the main body 1 is represented by M includes: processing the pads 3 at the bottom of two middle columns of perforations 2; allowing the perforations 2 in a first side of a boundary between two middle columns of pads 3 to perform outgoing away from the boundary, and processing the pads 3, at the ends of the outgoing lines, on the bottom face of the main body 1, whereby the pads 3 are connected to the corresponding outgoing lines and perforations 2; and allowing the perforations 2 in a second side of the boundary to perform outgoing away from the boundary, and processing the pads 3, at the ends of the outgoing lines, on the bottom face of the main body 1, whereby the pads 3 are connected to the corresponding outgoing lines and perforations 2.

In one embodiment, the allowing the perforations 2 in a first side of a boundary to perform outgoing away from the boundary, and processing the pads 3, at the ends of the outgoing lines, on the bottom face of the main body 1, whereby the pads 3 are connected to the corresponding outgoing lines and perforations 2 includes: determining a distance of leftward outgoing of the perforations 2 in column n/2−1 at an outgoing layer that is adjacent to a bottom layer as 1*P, reaching the perforations 2 in column n/2−2, and then connecting to the bottom layer through the perforations 2; determining a distance of leftward outgoing of the perforations 2 in column n/2−2 at an outgoing layer that is less adjacent to the bottom layer as 2*P, and then connecting to the bottom layer through the perforations 2; determining a distance of leftward outgoing of the perforations 2 in column n/2−3 at an outgoing layer that is further less adjacent to the bottom layer as 3*P, and then connecting to the bottom layer through the perforations 2; determining a distance of leftward outgoing of the perforations 2 in column n/2−t at an outgoing layer that is further less adjacent to the bottom layer as t*P, and then connecting to the bottom layer through the perforations 2, where t=1, 2, 3, . . . , n/2−1; and so on, determining a distance of leftward outgoing of the perforations 2 in column 1 as (n/2−1)*P, and then connecting to the bottom layer through the perforations 2.

Taking M=2P as an example, the detailed process of manufacturing the adapter board is that two middle columns, namely columns n/2 and n/2+1, of perforations are through holes. Leftward outgoing is performed in columns having sequence numbers smaller than n/2, and rightward outgoing is performed in columns having sequence numbers greater than n/2+1. It is assumed that the number of PCB layers of the adapter board is L. When t=1, a distance of leftward outgoing of the perforations in column n/2−t=n/2−1 at an outgoing layer that is adjacent to the bottom layer, namely layer L−2t=L−2 is t*P=1*P, that is, the perforations in column n/2−2 is reached, and the outgoing lines are then connected to the bottom layer through the perforations at the lower side of outgoing. When t=2, a distance of leftward outgoing of the perforations in column n/2−t=n/2−2 at an outgoing layer that is less adjacent to the bottom layer, namely layer L−2t=L−4 is t*P=2P, and the outgoing lines are then connected to the bottom layer through the perforations at the lower side of outgoing. A distance of leftward outgoing of the perforations in column n/2−3 at an outgoing layer that is further less adjacent to the bottom layer, namely layer L−3t=L−6 is t*P=3P, and the outgoing lines are then connected to the bottom layer through the perforations at the lower side of outgoing, and so on, after an outgoing distance of t*P of the perforations in column n/2−t at layer L−2t, the outgoing lines are connected to the pads on the bottom layer. When t=n/2−1, that is, n/2−t is column 1, after an outgoing distance of (n/2−1)*P at layer L−2t=L−2*(n/2−1)=L−(n−2), the outgoing lines are connected to the bottom layer. At this moment, all outgoing lines of the adapter board are completed, and the outgoing layer L−(n−2) should be layer 2. Therefore, the number of layers of the adapter board is L=n. That is, the number of layers of the adapter board is the same as the column number of the connector. The outgoing method for column n/2+t is the same as that for column n/2−t, and will not be described in detail herein.

In the structural design, with reference to the two middle columns of perforations, the number of outgoing layers of the perforations in each column gradually approaches the top layer along the direction away from the two middle columns of perforations. In this way, the perforation interference situation in the outgoing process can be reasonably optimized. While the corresponding connection between the perforations 2 and the pads 3 is realized, the position conversion between the top layer and the bottom layer of the perforations 2 can be realized through the outgoing of different middle layers, so as to avoid the problem that the connection positions of the perforations 2 and the outgoing layers cannot be effectively allocated due to interference caused by the mismatch between the design of the outgoing layers and the position of the perforations 2.

In one embodiment, the perforations 2 are treated by a blind buried perforation or broken perforation process at a location where lateral outgoing lines interfere with the perforations 2.

In one embodiment, the perforations 2 connected to the bottom layer form the pads 3 on the bottom face of the main body 1 by electroplating and filling.

The entire manufacturing process of the adapter board is described in sequence below:

1. The number of outgoing layers Y required for a target backplane or large high-speed board is confirmed according to actual demands or costs.
2. The specifications of the connector used, namely the column number r and the column number n, are confirmed.
3. The minimum required spacing H of differential lines is confirmed. Generally speaking, H=P/2. In other words, only one pair of differential lines outgoing between two columns can be obtained.
4. A ratio x of a bottom pad spacing M of the adapter board to a connector column spacing P is calculated through the following formula according to a required target number of layers Y, the number of connector rows r, and the outgoing manner. In other words, x=M/P.

For one-way outgoing, H=P/2. The target number of layers is: Y=(row number r−1)/(2x−1) (Y≥1, and it is rounded up).

For two-way outgoing, H=P/2. The target number of layers is: Y=(row number r−2)/2*(2x−1) (Y≥1, and it is rounded up).

In the actual design process, x is not necessarily an integer. Therefore, the calculation result of Y may not be an integer. At this moment, Y needs to be rounded up to ensure that the layout requirements of the board card 6 can be met.

5. The outgoing of the adapter board is implemented using x calculated in 4 (this distance is not necessarily an integer multiple of P, and it is assumed that movement is performed according to an integer multiple of P). Assuming that the connector spacing is represented by P, the column spacing of the pads in the bottom layer of the adapter board should be x*P. Then the two middle sets of perforations, namely n/2 and n/2+1, do not need to be moved. After an outgoing distance of the perforations in column n/2−t (t=1, 2, 3, . . . , n/2−1) at layer L−2t is t*P, the outgoing lines are connected to the pads on the bottom layer. When t=n/2−1, that is, n/2−t is column 1, after an outgoing distance of the perforations at layer 2 is (n/2−1)*P, the outgoing lines are connected to the bottom layer. At this moment, the planning of the outgoing layers of the adapter board is completed, and the number of layers of the adapter board L=the number of connector columns n. When x is a non-integer, the foregoing method may still be applied. The difference is that when x is a non-integer, the original perforation structure on the adapter board cannot be effectively utilized, and the position of the perforations in the bottom layer needs to be readjusted according to the outgoing positions of different layers on the adapter board, whereby the perforations in the bottom layer can form a good match with the outgoing lines of the corresponding layers on the adapter board. Therefore, the perforations 2 in the top layer and the corresponding perforations 2 in the bottom layer can form a connection through the corresponding outgoing layers on the adapter board, thereby realizing the expansion of the column spacing between the perforations 2 in the bottom layer, whereby the column spacing of the pads 3 can meet the design requirements.

6. The number of layers L of the adapter board is generally the same as the number of connector columns n. The signal layer of the adapter board uses thin dielectric as much as possible to reduce the thickness of the adapter board. Both perforations and adapter lines must be strictly controlled in impedance to minimize the influence of the adapter board on the signals.
7. A blind buried perforation, back drilling process or other broken perforation processes may be used in the process of perforation movement to ensure that the routing may pass through the perforation area smoothly.
8. The formed perforation array is electroplated and filled to form a pad array on the outer layer.
9. The adapter board and the target board are soldered, and outgoing is completed on the target board. By using the foregoing method, according to the relationship between H and xP, it is confirmed how many outgoing lines K may be routed between every two columns of pads, where K is representing an allowable number of routing in the column spacing of the pads 3. K=(x*P/H)−1 for one-side outgoing, and K=2*(x*P/H−1) for two-side outgoing. If H=P/2, K=x*P/(P/2)−1=2x−1 for one-side outgoing, and K=2*(2x−1) for two-side outgoing.
10. If the main purpose is to control crosstalk, the required line spacing H may be increased, and the number of outgoing line sets K between columns may be appropriately reduced, which may increase Y. Therefore, the most suitable manner is selected as needed.

Referring to FIG. 3 to FIG. 9, according to an embodiment of the present application, a board card connecting structure includes a connector 5 and a board card 6, and further includes the foregoing adapter board 4. The adapter board 4 is connected between the connector 5 and the board card 6. A plug of the connector 5 is in plug-in fit with perforations 2 in a top face of the adapter board 4. Pads 3 on a bottom face of the adapter board 4 are soldered to the board card 6.

In the related art, the plugs of the connector 5 have a one-by-one correspondence with the perforations of the board card 5. Due to the miniaturized design of the connector 5, the plug spacing is relatively close, and only a pair of differential lines can be routed between two columns of plugs. Through the adapter board 4 according to the embodiments of the present application, the distance between the perforations of the board card 5 originally close to each other can be increased, the pads may be formed on the surface of the adapter board 4, and then the adapter board 4 and the target board card 5 may be soldered. At this moment, a plurality of sets of differential lines 7 may be obtained from one layer of the target board card 5, and all the outgoing lines can be completed with a small number of layers, so as to achieve the purpose of reducing layers of the board card. Also, if the space of the target board allows, a wider differential line spacing may be designed to reduce crosstalk in the connector outgoing area while reducing layers.

In this embodiment, the adapter board 4 is arranged on the board card 6, and the connector 5 is arranged on the adapter board 4. Generally speaking, the area of the adapter board 4 is larger than the area of the connector 5, and the area of the adapter board 4 is smaller than the area of the board card 6. Therefore, an upper surface of the adapter board 4 may be provided with a jack structure for fitting the plug of the connector 5, and a lower surface of the adapter board 4 is provided with a pad structure soldered to the board card 6. Since the lower surface area of the adapter board 4 is larger than the area of the connector 5, there is a larger space for designing the column spacing of the pad structure, whereby the column spacing of the perforations of the board card 6 fitting the pads is also correspondingly increased, and the column spacing can accommodate more differential lines. Thus, the number of layout layers required for the connection between the board card 6 and the connector 5 can be reduced, the layout cost can be reduced, and the design difficulty and cost of the board card 6 can be reduced.

In one embodiment, the board card 6 is a single board or a backplane.

The single board is a functional module composed of a single PCB (backplane connection, such as cable bridging or laminated connection, is not necessarily required).

The backplane is a special board for connecting individual single boards to form a complete box system.

Compared with the single board, the technical requirements of the backplane may be higher (involving power and speed, etc.). The technical indicators of the backplane directly affect the performance of the entire system.

The functions of the circuit board are relatively complex, and there are many devices that cannot be accommodated by one circuit board. The system has very strict requirements on the size of the circuit board, but there is no limit on the height. Connectors may be placed on the circuit board, and a plurality of circuit boards may be plugged together. It is possible that one board is carried by another circuit board while carrying another circuit board.

In one embodiment, when $M \geq r*H$, the board card 6 employs single-layer layout.

When $M = r*H$, adjacent pads 3 may be spaced by $r-1*H$ spacings, and a differential line may be arranged at each H spacing. Since each column of pads 3 includes r pads 3 and outgoing side pads of a single column may directly perform outgoing, when the column spacing of pads 3 is represented by M, $r-1+1=r$ outgoing lines may be accommodated in the line passing area between the adjacent pads 3. In other words, r outgoing lines may be accommodated in the line passing area between adjacent perforations of the board card 6. Since the row number of the board card 6 is represented by r, r outgoing lines are needed, and the width of the line passing area between the adjacent perforations of the board card 6 may meet the width required by the outgoing lines of the same row of perforations in the same layer. At this moment, the board card 6 only needs a single-layer structure to realize the outgoing of each perforation, which meets the outgoing requirement of the board card 6. Since the board card 6 may adopt a single-layer structure, the structural complexity of the board card 6 is greatly reduced, the design difficulty and cost are also greatly reduced, and the spacing between the differential lines 7 of the board card 6 may also meet the design requirement, thus realizing the simple and convenient design of the board card 6.

In one embodiment, when the row numbers r and column numbers n of the perforations 2 and the pads 3 are both even numbers and $M \geq (r/2+1) H$, the board card 6 employs double-layer layout in the same outgoing direction.

In this embodiment, the adapter board structure is suitable for a double-layer board card structure, and the outgoing direction of a single column of perforations of the double-layer board card structure is the same. In this embodiment, when the board card structure is a double-layer structure, among the perforations of the first layer, the perforations at the outgoing end may directly perform outgoing, and the outgoing spacing of other perforations is $(M-1+1)/(r/2) \geq (r/2+1-1+1)*H(r/2)=H+2H/r>H$. At this moment, the outgoing spacing of the board card may meet the outgoing width requirement. Among the perforations of the second layer, since the line passing direction of a single column of perforations is the same, there are no perforations that may directly perform outgoing among the perforations of the second layer, and misaligned outgoing is needed. At this moment, the outgoing spacing of the perforations of the second layer is $(M-1)/(r/2) \geq (r/2+1-1)*H/(r/2)=H$, and the outgoing width requirement may also be met. If M is set to $M=r/2*H$ at this moment, the outgoing spacing of the first layer may meet the outgoing requirements, but the outgoing spacing of the second layer will be too small to meet the outgoing width requirements due to the need to avoid interference between the perforations.

In one embodiment, when the row numbers r and column numbers n of the perforations 2 and the pads 3 are both even numbers and $M \geq r/2*H$, the board card 6 employs single-layer layout, the layout achieving two-way outgoing in a column direction of the board card 6.

In this embodiment, for an outgoing structure on a first side of a midpoint of the board card, among the perforations of the first layer, the perforations at the outgoing end may directly perform outgoing, and the outgoing spacing of other perforations is $(M-1+1)/(r/2) \geq (r/2-1+1)*H(r/2)=H$. At this moment, the outgoing spacing of the board card may meet the outgoing width requirement. For an outgoing structure on a second side of the midpoint of the board card, among the perforations of the second side, since the outgoing direction of the perforations of the second side is different from the outgoing direction of the perforations of the first side, the perforations at the outgoing end may directly perform outgoing without interfering with the perforations of the first side, and the outgoing spacing of other perforations is $(M-1+1)/(r/2) \geq (r/2-1+1)*H/(r/2)=H$. At this moment, the outgoing spacing of the board card may meet the outgoing width requirement.

In one embodiment, the row numbers r and column numbers n of the perforations 2 and the pads 3 are both even numbers, where $M \geq 2 (r/2+1)*H$. This scheme may be applied to a two-way outgoing structure of the double-layer board card structure.

The adapter board according to the embodiments of the present application has the following advantages:

Due to the small size, small layer number and low cost of the adapter board, the number of PCB layers of a backplane or other large boards can be effectively reduced, thereby reducing the PCB cost. The outgoing spacing is flexibly controlled to reduce crosstalk in the connector outgoing area.

It is to be noted that the terms used herein are for the purpose of describing detailed embodiments only and are not intended to be limiting of exemplary embodiments according to the present application. As used herein, the singular form is intended to include the plural form unless the context clearly dictates otherwise. Furthermore, it will be appreciated that the terms "including" and/or "comprising", when used in this specification, specify the presence of features, steps, operations, devices, components, and/or combinations thereof.

It is to be noted that the terms "first", "second", and the like in the specification and claims of the present application and the drawings are used for distinguishing similar objectives, and are not necessarily used for describing a certain order or sequence. It will be appreciated that data so used are interchangeable under appropriate circumstances, whereby the embodiments of the present application described herein can be implemented in orders other than those illustrated or described herein.

The above descriptions are only preferred embodiments of the present application and are not intended to limit the present application. It will be apparent to those skilled in the art that various modifications and variations can be made in the present application. Any modifications, equivalent replacements, improvements, and the like that come within the spirit and principles of the present application are intended to be within the protection scope of the present application.

What is claimed is:

1. An adapter board, configured to realize adaptation between a connector (5) and a board card (6), comprising a main body (1), wherein perforations (2) are provided in a top face of the main body (1), and the perforations (2) are configured to be in plug-in fit with a plug of the connector (5); pads (3) are provided on a bottom face of the main body (1), and the pads (3) are configured to be soldered to the board card (6); row numbers, represented by r, and column numbers, represented by n, of the perforations (2) and the pads (3) are the same, and the perforations (2) have a one-by-one correspondence with the pads (3); the main body (1) further comprises a line passing area located between two adjacent columns of pads (3); and a column spacing of the perforations (2) in the top face of the main body (1) is represented by P, and a column spacing of the pads (3) on two sides of the line passing area is represented by M, wherein M−P>H, and H represents a minimum spacing allowed between adjacent differential lines (7) of the board card (6).

2. The adapter board according to claim 1, wherein under a circumstance that the board card (6) performs one-way outgoing, a required number of routing layers represented by Y, Y=(r−1)/(2x−1), wherein x=M/P, Y≥1, and the number is rounded up.

3. The adapter board according to claim 1, wherein under a circumstance that the board card (6) performs two-way outgoing, a required number of routing layers represented by Y, Y=(r−2)/2*(2x−1), wherein x=M/P, Y≥1, and the number is rounded up.

4. The adapter board according to claim 1, wherein M≥r*H.

5. The adapter board according to claim 1, wherein the row numbers and column numbers of the perforations (2) and the pads (3) are both even numbers, wherein M≥(r/2+1) H.

6. The adapter board according to claim 1, wherein the row numbers and column numbers of the perforations (2) and the pads (3) are both even numbers, wherein M≥r/2*H.

7. The adapter board according to claim 1, wherein the column spacing between two middle columns of pads (3) is represented by P, the perforations (2) in a first side of a boundary between the two middle columns of pads (3) perform outgoing away from the boundary, and the perforations (2) in a second side of the boundary perform outgoing away from the boundary.

8. The adapter board according to claim 1, wherein the column spacing between two middle columns of pads (3) is represented by M, and the perforations (2) in all columns perform outgoing to one side.

9. The adapter board according to claim 7, wherein the number of layers of the adapter board is represented by L, two middle columns of perforations (2) are perforations (2) in column n/2 and perforations (2) in column n/2+1 respectively, the perforations (2) in column n/2 and the perforations (2) in column n/2+1 are through holes, the perforations (2) in columns smaller than n/2 perform leftward outgoing, and the perforations (2) in columns greater than n/2+1 perform rightward outgoing, wherein lines outgoing from different columns of perforations (2) in the same side of the two middle columns of perforations (2) are located in different layers.

10. The adapter board according to claim 9, wherein along a direction away from the perforations (2) in column n/2, after an outgoing distance of the perforations in column n/2-t (t=1, 2, 3, . . . , n/2−1) at layer L−2t is represented by t*P, the outgoing lines are connected to the pads on a bottom layer, when t=n/2-1, after an outgoing distance of the perforations at layer 2 is represented by (n/2−1)*P, the outgoing lines are connected to the bottom layer.

11. The adapter board according to claim 10, wherein under a circumstance that lateral outgoing lines interfere with the perforations (2), the perforations (2) are treated by a blind buried perforation or broken perforation process.

12. The adapter board according to claim 10, wherein stubs of the perforations (2) are treated by a back drilling process for the perforations (2).

13. The adapter board according to claim 10, wherein the perforations (2) connected to the bottom layer form the pads (3) by electroplating and filling.

14. The adapter board according to claim 10, wherein a left structure and a right structure of the adapter board are symmetrical about a boundary between the two middle columns of perforations (2).

15. The adapter board according to claim 1, wherein a spacing between the adjacent differential lines (7) is greater than or equal to 1.5 H.

16. A manufacturing method for an adapter board, wherein the adapter board comprises a main body (1), perforations (2) are provided in a top face of the main body (1), and the perforations (2) are configured to be in plug-in fit with a plug of the connector (5); pads (3) are provided on a bottom face of the main body (1), and the pads (3) are configured to be soldered to the board card (6); row numbers, represented by r, and column numbers, represented by n, of the perforations (2) and the pads (3) are the same, and the perforations (2) have a one-by-one correspondence with the pads (3); the main body (1) further comprises a line passing area located between two adjacent columns of pads (3); and a column spacing of the perforations (2) in the top face of the main body (1) is represented by P, and a column spacing of the pads (3) on two sides of the line passing area is represented by M, M−PH, and H represents a minimum spacing allowed between adjacent differential lines (7) of the board card (6), wherein the method comprising:

manufacturing a main body (1);

processing perforations (2) in a top face of the main body (1), whereby a column spacing of the perforations (2) in the top face is represented by P; and processing pads (3) on a bottom face of the main body (1), whereby a column spacing of the pads (3) on two sides of a line passing area of the main body (1) is represented by M, wherein M−P≥H, H is representing a minimum spacing allowed between adjacent outgoing lines of the board card (6), row numbers and column numbers of the perforations (2) and the pads (3) are the same, and the perforations (2) have a one-by-one correspondence with the pads (3).

17. The manufacturing method according to claim 16, wherein the processing perforations (2) in a top face of the main body (1), whereby a column spacing of the perforations (2) P comprises:

processing through holes in the top face of the main body (1) according to a preset row spacing, wherein a column spacing between the through holes is represented by P, and the through holes serve as the perforations (2).

18. The manufacturing method according to claim 17, wherein the processing pads (3) on a bottom face of the main body (1), whereby a column spacing of the pads (3) on two sides of a line passing area of the main body (1) is represented by M comprises:

processing the pads (3) at the bottom of two middle columns of perforations (2);

allowing the perforations (2) in a first side of a boundary between two middle columns of pads (3) to perform outgoing away from the boundary, and processing the pads (3), at the ends of the outgoing lines, on the bottom face of the main body (1), whereby the pads (3) are connected to the corresponding outgoing lines and perforations (2); and allowing the perforations (2) in a second side of the boundary to perform outgoing away from the boundary, and processing the pads (3), at the ends of the outgoing lines, on the bottom face of the main body (1), whereby the pads (3) are connected to the corresponding outgoing lines and perforations (2).

19. The manufacturing method according to claim 18, wherein the allowing the perforations (2) in the first side of the boundary to perform outgoing away from the boundary, and processing the pads (3), at the ends of the outgoing lines, on the bottom face of the main body (1), whereby the pads (3) are connected to the corresponding outgoing lines and perforations (2) comprises:

setting two middle columns of perforations (2) as perforations (2) in column n/2 and perforations (2) in column n/2+1 respectively, wherein the perforations (2) in column n/2 and the perforations (2) in column n/2+1 are through holes, the perforations (2) in columns smaller than n/2 perform leftward outgoing, and the perforations (2) in columns greater than n/2+1 perform rightward outgoing;

determining a distance of leftward outgoing of the perforations (2) in column n/2−1 at an outgoing layer that is adjacent to a bottom layer as 1*P, reaching the perforations (2) in column n/2−2, and then connecting to the bottom layer through the perforations (2);

determining a distance of leftward outgoing of the perforations (2) in column n/2−2 at an outgoing layer that is less adjacent to the bottom layer as 2*P, and then connecting to the bottom layer through the perforations (2);

determining a distance of leftward outgoing of the perforations (2) in column n/2−3 at an outgoing layer that is further less adjacent to the bottom layer as 3*P, and then connecting to the bottom layer through the perforations (2);

determining a distance of leftward outgoing of the perforations (2) in column n/2−t at an outgoing layer that is further less adjacent to the bottom layer as t*P, and then connecting to the bottom layer through the perforations (2), wherein t=1, 2, 3, . . . , n/2−1;

and so on, determining a distance of leftward outgoing of the perforations (2) in column 1 as (n/2−1)*P, and then connecting to the bottom layer through the perforations (2).

20. A board card connecting structure, comprising a connector (5) and a board card (6), further comprising an adapter board (4), wherein the adapter board comprises a main body (1), perforations (2) are provided in a top face of the main body (1), and the perforations (2) are configured to be in plug-in fit with a plug of the connector (5); pads (3) are provided on a bottom face of the main body (1), and the pads (3) are configured to be soldered to the board card (6); row numbers, represented by r, and column numbers, represented by n, of the perforations (2) and the pads (3) are the same, and the perforations (2) have a one-by-one correspondence with the pads (3); the main body (1) further comprises a line passing area located between two adjacent columns of pads (3); and a column spacing of the perforations (2) in the top face of the main body (1) is represented by P, and a column spacing of the pads (3) on two sides of the line passing area is represented by M, M−P>H, and H represents a minimum spacing allowed between adjacent differential lines (7) of the board card (6), wherein the adapter board (4) is connected between the connector (5) and the board card (6), a plug of the connector (5) is in plug-in fit with perforations (2) in a top face of the adapter board (4), and pads (3) on a bottom face of the adapter board (4) are soldered to the board card (6).

* * * * *